(12) United States Patent
De et al.

(10) Patent No.: US 10,067,865 B2
(45) Date of Patent: Sep. 4, 2018

(54) SYSTEM AND METHOD FOR ALLOCATING MEMORY TO DISSIMILAR MEMORY DEVICES USING QUALITY OF SERVICE

(71) Applicant: QUALCOMM INCORPORATED, San Diego, CA (US)

(72) Inventors: Subrato K. De, San Diego, CA (US); Richard A. Stewart, San Diego, CA (US); Gheorghe Calin Cascaval, San Diego, CA (US); Dexter T. Chun, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 281 days.

(21) Appl. No.: 14/744,831

(22) Filed: Jun. 19, 2015

(65) Prior Publication Data

US 2015/0286565 A1 Oct. 8, 2015

Related U.S. Application Data

(63) Continuation of application No. 13/781,366, filed on Feb. 28, 2013, now Pat. No. 9,092,327, which is a
(Continued)

(51) Int. Cl.
*G06F 12/00* (2006.01)
*G06F 12/02* (2006.01)
(Continued)

(52) U.S. Cl.
CPC ........ *G06F 12/023* (2013.01); *G06F 12/0607* (2013.01); *G06F 12/0638* (2013.01);
(Continued)

(58) Field of Classification Search
None
See application file for complete search history.

(56) References Cited

U.S. PATENT DOCUMENTS

| 7,620,793 B1 | 11/2009 | Edmondson et al. |
| 7,680,830 B1 * | 3/2010 | Ohr ................... G06F 17/30085 |
| | | 707/999.2 |

(Continued)

FOREIGN PATENT DOCUMENTS

| CN | 1347033 A | 5/2002 |
| CN | 102426552 A | 4/2012 |

(Continued)

OTHER PUBLICATIONS

Wikipedia, "Multi-channel Memory Architecture", § 1.1, available at https://web.archive.org/web/20111020015335/https://en.wikipedia.org/wiki/Multi-channel_memory_architecture (Year: 2011).*

(Continued)

*Primary Examiner* — David Yi
*Assistant Examiner* — Craig S Goldschmidt
(74) *Attorney, Agent, or Firm* — Smith Tempel Blaha LLC

(57) ABSTRACT

Systems and methods are provided for allocating memory to dissimilar memory devices. An exemplary embodiment includes a method for allocating memory to dissimilar memory devices. An interleave bandwidth ratio is determined, which comprises a ratio of bandwidths for two or more dissimilar memory devices. The dissimilar memory devices are interleaved according to the interleave bandwidth ratio to define two or more memory zones having different performance levels. Memory address requests are allocated to the memory zones based on a quality of service (QoS).

40 Claims, 13 Drawing Sheets

Related U.S. Application Data continuation-in-part of application No. 13/726,537, filed on Dec. 24, 2012, now Pat. No. 8,959,298.

(60) Provisional application No. 61/735,352, filed on Dec. 10, 2012.

(51) Int. Cl.
G06F 12/06 (2006.01)
G11C 7/10 (2006.01)

(52) U.S. Cl.
CPC .... *G11C 7/1072* (2013.01); *G06F 2212/1044* (2013.01); *Y02D 10/13* (2018.01)

(56) References Cited

U.S. PATENT DOCUMENTS

| | | | |
|---|---|---|---|
| 7,768,518 B2 | 8/2010 | Collins et al. | |
| 8,194,085 B2 | 6/2012 | Greco et al. | |
| 8,289,333 B2 | 10/2012 | Schreyer et al. | |
| 8,314,807 B2 | 11/2012 | Biswas et al. | |
| 8,438,138 B2 * | 5/2013 | Rathi | G06F 3/048 707/665 |
| 8,669,988 B2 | 3/2014 | Anderson et al. | |
| 8,959,298 B2 | 2/2015 | Chun et al. | |
| 2002/0065922 A1 * | 5/2002 | Shastri | H04L 29/06 709/227 |
| 2002/0075844 A1 * | 6/2002 | Hagen | H04L 63/0442 370/351 |
| 2004/0260864 A1 | 12/2004 | Lee et al. | |
| 2005/0235124 A1 | 10/2005 | Pomaranski et al. | |
| 2007/0180203 A1 | 8/2007 | Ramgarajan et al. | |
| 2008/0016308 A1 | 1/2008 | Bartley et al. | |
| 2008/0250212 A1 * | 10/2008 | Asaro | G06F 12/0607 711/157 |
| 2009/0150710 A1 | 6/2009 | Bilger et al. | |
| 2009/0228631 A1 | 9/2009 | Marulkar et al. | |
| 2010/0118041 A1 | 5/2010 | Chen et al. | |
| 2010/0228923 A1 | 9/2010 | Lim | |
| 2010/0321397 A1 | 12/2010 | Ginzburg | |
| 2011/0154104 A1 | 6/2011 | Swanson et al. | |
| 2011/0157195 A1 | 6/2011 | Sprangle et al. | |
| 2011/0320751 A1 | 12/2011 | Wang et al. | |
| 2012/0054455 A1 | 3/2012 | Wang et al. | |
| 2012/0155160 A1 | 6/2012 | Alam et al. | |
| 2012/0162237 A1 | 6/2012 | Chung | |
| 2012/0331226 A1 | 12/2012 | Krishnan et al. | |
| 2014/0101379 A1 | 4/2014 | Tomlin | |
| 2014/0164690 A1 | 6/2014 | De et al. | |
| 2014/0164720 A1 | 6/2014 | Stewart et al. | |

FOREIGN PATENT DOCUMENTS

| | | |
|---|---|---|
| EP | 1591897 A2 | 11/2005 |
| JP | 2007193810 A | 8/2007 |
| JP | 2011054184 A | 3/2011 |
| KR | 20130106392 A | 9/2013 |
| TW | 201205305 A | 2/2012 |
| WO | WO-9004576 A2 | 5/1990 |
| WO | 05088939 | 9/2005 |

OTHER PUBLICATIONS

Taiwan Search Report—TW102141943—TIPO—dated Aug. 4, 2015.

International Search Report and Written Opinion—PCT/US2013/068217—ISA/EPO—dated Feb. 10, 2014.

Li J., et al., "An Optimized Large-Scale Hybrid DGEMM Design for CPUs and ATI GPUs," ICS '2012 Proceedings of the 26th ACM international conference on Supercomputing, 2012, pp. 377-386.

Texas Instruments, "DaVinci Digital Video Processor—datasheet", Texas Instruments, SPRS614D Mar. 2011. Revised Jan. 2013, pp. 151-327.

Jian K., et al., "AVSS: An Adaptive Virtual Storage System", Journal of Computer Research and Development, No. S1, Dec. 31, 2009.

Jingli Z., et al., "A Method of Data Assignment on a Heterogenous Disk System", Journal of Chinese Computer Systems, Nov. 30, 2004.

* cited by examiner

| ADDRESS BLOCK | INTERLEAVE BANDWIDTH RATIO | | |
| --- | --- | --- | --- |
| | 1:1 | 2:1 | 1:2 |
| N | wideio2 | wideio2 | wideio2 |
| N + 1 | lpddr3e | wideio2 | lpddr3e |
| N + 2 | wideio2 | lpddr3e | lpddr3e |
| N + 3 | lpddr3e | wideio2 | wideio2 |
| N + 4 | wideio2 | wideio2 | lpddr3e |
| N + 5 | lpddr3e | lpddr3e | lpddr3e |
| N + 6 | wideio2 | wideio2 | wideio2 |

FIG. 5

SYSTEM AND METHOD FOR ALLOCATING MEMORY TO DISSIMILAR MEMORY DEVICES USING QUALITY OF SERVICE

PRIORITY AND RELATED APPLICATIONS STATEMENT

This application is continuation of and claims priority under 35 U.S.C. § 120 to U.S. patent application Ser. No. 13/781,366, filed on Feb. 28, 2013, entitled, "System and Method for Allocating Memory to Dissimilar Memory Devices using Quality of Service" which is a continuation-in-part patent application of U.S. patent application Ser. No. 13/726,537 filed on Dec. 24, 2012, and entitled "System and Method for Managing Performance of a Computing Device Having Dissimilar Memory Types," now U.S. Pat. No. 8,959,298, issued on Feb. 17, 2015, which claims priority under 35 U.S.C. 119(e) to U.S. Provisional Patent Application filed on Dec. 10, 2012, assigned Provisional Application Ser. No. 61/735,352, and entitled "System and Method for Managing Performance of a Computing Device Having Dissimilar Memory Types," each of which are hereby incorporated by reference in their entirety.

DESCRIPTION OF THE RELATED ART

System performance and power requirements are becoming increasingly demanding in computer systems and devices, particularly in portable computing devices (PCDs), such as cellular telephones, portable digital assistants (PDAs), portable game consoles, palmtop computers, tablet computers, and other portable electronic devices. Such devices may comprise two or more types of processing units optimized for a specific purpose. For example, one or more central processing units (CPUs) may used for general system-level performance or other purposes, while a graphics processing unit (GPU) may be specifically designed for manipulating computer graphics for output to a display device. As each processor requires more performance, there is a need for faster and more specialized memory devices designed to enable the particular purpose(s) of each processor. Memory architectures are typically optimized for a specific application. CPUs may require high-density memory with an acceptable system-level performance, while GPUs may require relatively lower-density memory with a substantially higher performance than CPUs.

As a result, a single computer device, such as a PCD, may include two or more dissimilar memory devices with each specialized memory device optimized for its special purpose and paired with and dedicated to a specific processing unit. In this conventional architecture (referred to as a "discrete" architecture), each dedicated processing unit is physically coupled to a different type of memory device via a plurality of physical/control layers each with a corresponding memory channel. Each dedicated processing unit physically accesses the corresponding memory device at a different data rate optimized for its intended purpose. For example, in one exemplary configuration, a general purpose CPU may physically access a first type of dynamic random access memory (DRAM) device at an optimized data bandwidth (e.g., 17 Gb/s). A higher-performance, dedicated GPU may physically access a second type of DRAM device at a higher data bandwidth (e.g., 34 Gb/s). While the discrete architecture individually optimizes the performance of the CPU and the GPU, there are a number of significant disadvantages.

To obtain the higher performance, the GPU-dedicated memory must be sized and configured to handle all potential use cases, display resolutions, and system settings. Furthermore, the higher performance is "localized" because only the GPU is able to physically access the GPU-dedicated memory at the higher data bandwidth. While the CPU can access the GPU-dedicated memory and the GPU can access the CPU-dedicated memory, the discrete architecture provides this access via a physical interconnect bus (e.g., a Peripheral Component Interconnect Express (PCIE)) between the GPU and the CPU at a reduced data bandwidth, which is typically less than the optimized bandwidth for either type of memory device. Even if the physical interconnect bus between the GPU and the CPU did not function as a performance "bottleneck", the discrete architecture does not permit either the GPU or the CPU to take advantage of the combined total available bandwidth of the two different types of memory devices. The memory spaces of the respective memory devices are placed in separate contiguous blocks of memory addresses. In other words, the entire memory map places the first type of memory device in one contiguous block and separately places the second type of memory device in a different contiguous block. There is no hardware coordination between the memory ports of the different memory devices to support physical access residing within the same contiguous block.

Accordingly, while there is an increasing demand for more specialized memory devices in computer systems to provide increasingly more system and power performance in computer devices, there remains a need in the art for improved systems and methods for managing dissimilar memory devices.

SUMMARY OF THE DISCLOSURE

Systems and methods are provided for allocating memory to dissimilar memory devices. An exemplary embodiment comprises a method for allocating memory to dissimilar memory devices. An interleave bandwidth ratio is determined, which comprises a ratio of bandwidths for two or more dissimilar memory devices. The dissimilar memory devices are interleaved according to the interleave bandwidth ratio to define two or more memory zones having different performance levels. Memory address requests are allocated to the memory zones based on a quality of service (QoS).

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

FIG. 5 is an exemplary table illustrating a memory channel address remapping based on various interleave bandwidth ratios.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the terms "communication device," "wireless device," "wireless telephone", "wireless communication device," and "wireless handset" are used interchangeably. With the advent of third generation ("3G") wireless technology and four generation ("4G"), greater bandwidth availability has enabled more portable computing devices with a greater variety of wireless capabilities. Therefore, a portable computing device may include a cellular telephone, a pager, a PDA, a smartphone, a navigation device, or a hand-held computer with a wireless connection or link.

Figure 1:
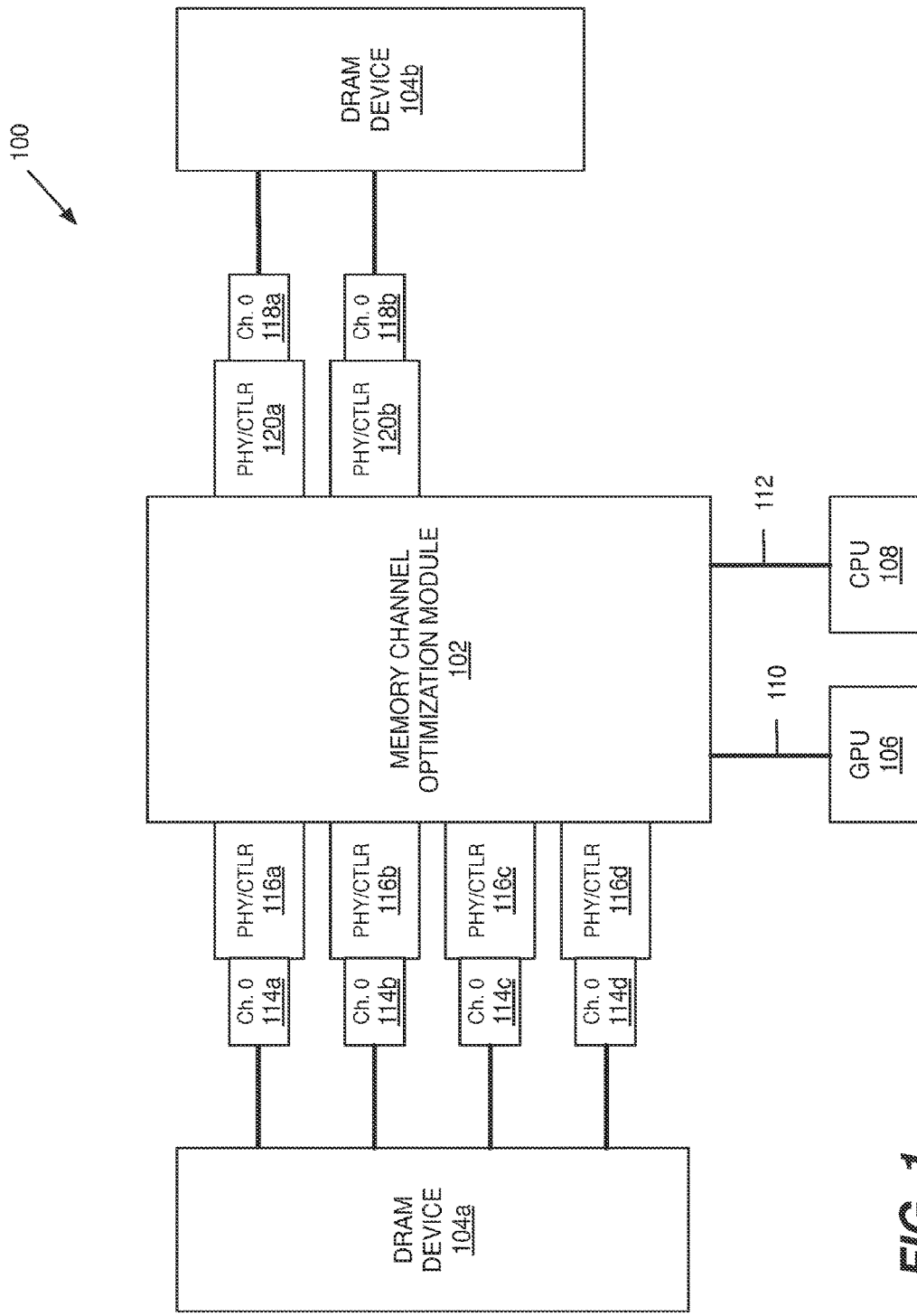
FIG. 1 is a block diagram of an embodiment of system for managing dissimilar memory devices.

FIG. 1 illustrates a system 100 comprising a memory management architecture that may be implemented in any suitable computing device having two or more dedicated processing units for accessing two or more memory devices of different types, or similar types of memory devices having different data bandwidths (referred to as "dissimilar memory devices"). The computing device may comprise a personal computer, a workstation, a server, a portable computing device (PCD), such as a cellular telephone, a portable digital assistant (PDA), a portable game console, a palmtop computers, or a tablet computer, and any other computing device with two or more dissimilar memory devices. As described below in more detail, the memory management architecture is configured to selectively provide two modes of operation: a unified mode and a discrete mode. In the discrete mode, the memory management architecture operates as a "discrete architecture" in the conventional manner as described above, in which each dedicated processing unit accesses a corresponding memory device optimized for its intended purpose. For example, a dedicated general purpose central processing unit (CPU) may access a first type of memory device at an optimized data bandwidth, and a higher-performance, dedicated graphics processing unit (GPU) may access a second type of memory device at a higher data bandwidth. In the unified mode, the memory management architecture is configured to unify the dissimilar memory devices and enable the dedicated processing units to selectively access, either individually or in combination, the combined bandwidth of the dissimilar memory devices or portions thereof.

As illustrated in the embodiment of FIG. 1, the system 100 comprises a memory channel optimization module 102 electrically connected to two different types of dynamic random access memory (DRAM) devices 104a and 104b and two or more dedicated processing units (e.g., a CPU 108 and a GPU 106) that may access the DRAM devices 104a and 104b. GPU 106 is coupled to the memory channel optimization module 102 via an electrical connection 110. CPU 108 is coupled to the memory channel optimization module 102 via an electrical connection 112. The memory channel optimization module 102 further comprises a plurality of hardware connections for coupling to DRAM devices 104a and 104b. The hardware connections may vary depending on the type of memory device. In the example of FIG. 1, DRAM 104a supports four channels 114a, 114b, 114c, and 114d that connect to physical/control connections 116a, 116b, 116c, and 116d, respectively. DRAM 104b supports two channels 118a and 118b that connect to physical/control connections 120a and 120b, respectively. It should be appreciated that the number and configuration of the physical/control connections may vary depending on the type of memory device, including the size of the memory addresses (e.g., 32-bit, 64-bit, etc.).

Figure 2:
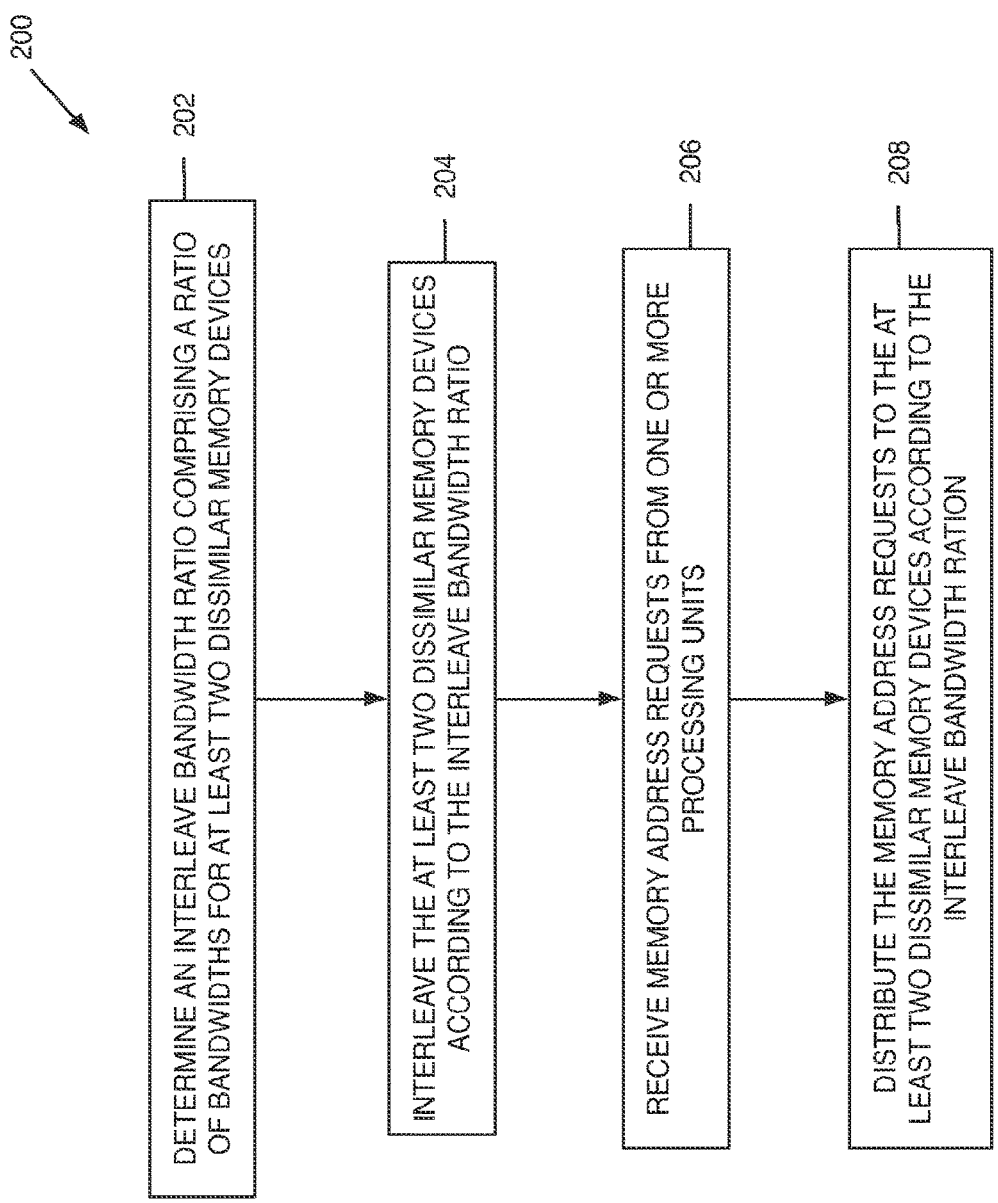
FIG. 2 is a flowchart of an embodiment of a method performed by the memory channel optimization module in FIG. 1 for managing dissimilar memory devices.

FIG. 2 illustrates a method 200 executed by the memory channel optimization module 102 for implementing the unified mode of operation by interleaving the dissimilar memory devices (e.g., DRAM devices 104a and 104b). At block 202, the memory channel optimization module 102 determines an interleave bandwidth ratio comprising a ratio of the data bandwidths for the DRAM devices 104a and 104b. The data bandwidths may be determined upon boot-up of the computing device.

Figure 3:
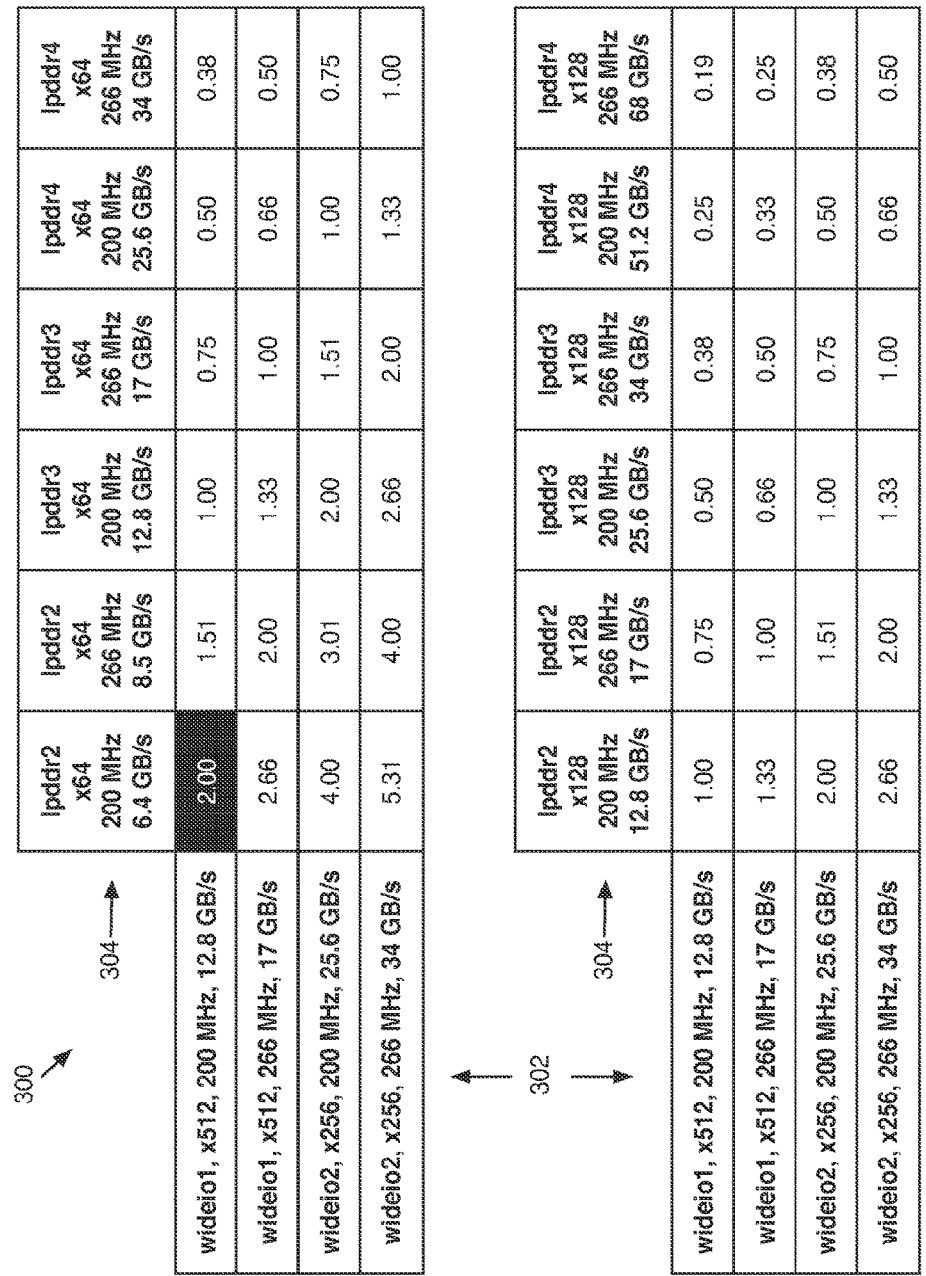
FIG. 3 is an exemplary table illustrating an interleave bandwidth ratio for various types of dissimilar memory devices.

In an embodiment, the interleave bandwidth ratio may be determined by accessing a data structure, such as, table 300 illustrated in FIG. 1. Table 300 identifies interleave bandwidth ratios for various combinations of types of dissimilar memory devices for implementing the two DRAM devices 104a and 104b. Columns 302 list various configurations for the DRAM device 104a. Rows 304 list various configurations for the DRAM device 104b. In this regard, each numerical data field identifies the interleave bandwidth ratio for the corresponding configuration row/column configuration. For example, the first data field in the upper portion of table 300 is highlighted in black and lists an interleave bandwidth ratio of 2.00, which corresponds to a bandwidth of 12.8 GB/s for the DRAM device 104a and a data bandwidth of 6.4 GB/s for the DRAM device 104b. In FIG. 3, the DRAM devices 104a and 104b are optimized for use in a mobile computing system. DRAM device 104b comprises a low power double data rate (LPDDR) memory device, which may be conventionally optimized for use in the discrete mode for dedicated use by the CPU 108. The DRAM device 104a comprises a Wide I/O (Wide IO) memory device, which may be conventionally optimized for use in the discrete mode for dedicated use by the GPU 106. In this regard, the numerical values identify the interleave bandwidth ratios for DRAM devices 104a and 104b according to variable performance parameters, such as, the memory address bit size (x64, x128, x256, x512), clock speed (MHz), and data bandwidth (GB/s). The memory channel optimization module 102 may perform a look-up to obtain the interleave bandwidth ratio associated with the DRAM devices 104a and 104b. At block 202 in FIG. 2, the memory channel optimization module 102 may also determine the numerical data bandwidths (e.g., from a table 300 or directly from the DRAM devices 104a and 104b) and then use this data to calculate the interleave bandwidth ratio.

It should be appreciated that the types of memory devices and performance parameters may be varied depending on the particular type of computing device, system applications, etc. in which the system 100 is being implemented. The example types and performance parameters illustrated in FIG. 3 are merely used in this description to describe an exemplary interleaving method performed by the memory channel optimization module 102 in a mobile system. Some examples of other random access memory technologies suitable for the channel optimization module 102 include NOR FLASH, EEPROM, EPROM, DDR-NVM, PSRAM, SRAM, PROM, and ROM. One of ordinary skill in the art will readily appreciate that various alternative interleaving schemes and methods may be performed.

Referring again to FIG. 2, at block 204, the memory channel optimization module 102 interleaves the DRAM devices 104a and 104b according to the interleave bandwidth ratio determined in block 202. The interleaving process matches traffic to each of the memory channels 114a, 114b, 114c, 114d and 118a and 118b for DRAM devices 104a and 104b, respectively, to the particular channel's available bandwidth. For example, if the DRAM device 104a has a data bandwidth of 34 GB/s and the DRAM device 104b has a data bandwidth of 17 GB/s, the interleave bandwidth ratio is 2:1. This means that the data rate of the DRAM device 104a is twice as fast as the data rate of the DRAM device 104b.

Figure 4:
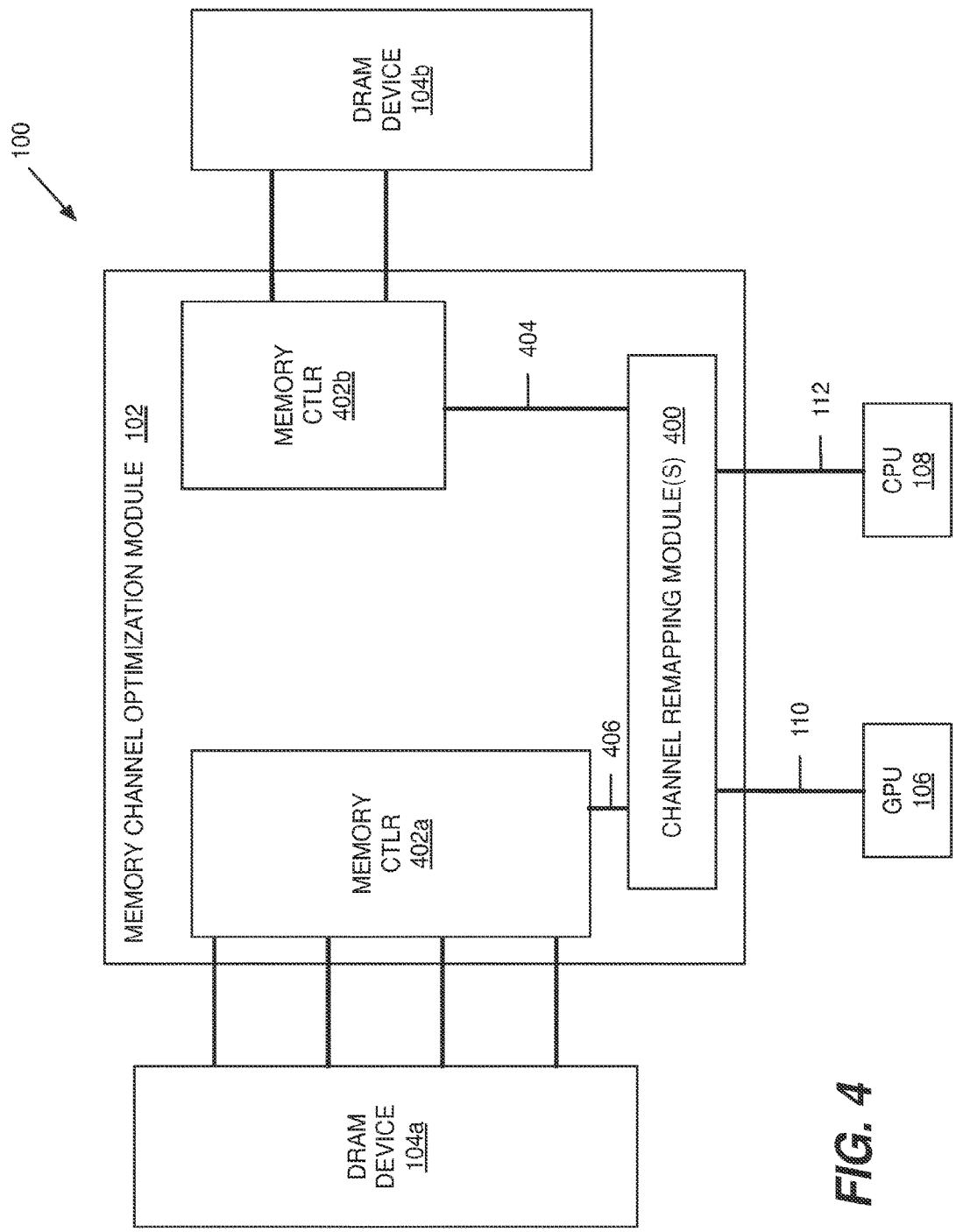
FIG. 4 is a block diagram illustrating components of the memory channel optimization module of FIG. 1.

As illustrated in FIG. 4, the memory channel optimization module 102 may comprise one or more channel remapping module(s) 400 for configuring and maintaining a virtual address mapping table for DRAM devices 104a and 104b according to the interleave bandwidth ratio and distributing traffic to the DRAM devices 104a and 104b according to the interleave bandwidth ratio. An exemplary address mapping table 500 is illustrated in FIG. 5. Address mapping table 500 comprises a list of address blocks 502 (which may be of any size) with corresponding channel and/or memory device assignments based on the interleave bandwidth ratio. For example, in FIG. 5, column 504 illustrates an alternating assignment between DRAM device 104a ("wideio2") and DRAM device 104b ("lpddr3e") based on an interleave bandwidth ratio of 1:1. Even numbered address blocks (N, N+2, N+4, N+6, etc.) are assigned to wideio2, and odd numbered address blocks (N+1, N+3, N+5, etc.) are assigned to lpddr3e.

Column 506 illustrates another assignment for an interleave bandwidth ratio of 2:1. Where DRAM device 104a ("wideio2") has a rate twice as fast as DRAM device 104b ("lpddr3e), two consecutive address blocks are assigned to wideio2 for every one address block assigned to lpddr3e. For example, address blocks N and N+1 are assigned to wideio2. Block N+2 is assigned to 1ppdr3e. Blocks N+3 and N+4 are assigned to wideio2, and so on. Column 508 illustrates another assignment for an interleave bandwidth ration of 1:2 in which the assignment scheme is reversed because the DRAM device 104b ("lpddr3e") is twice as fast as DRAM device 104a ("wideio2").

Figure 6:
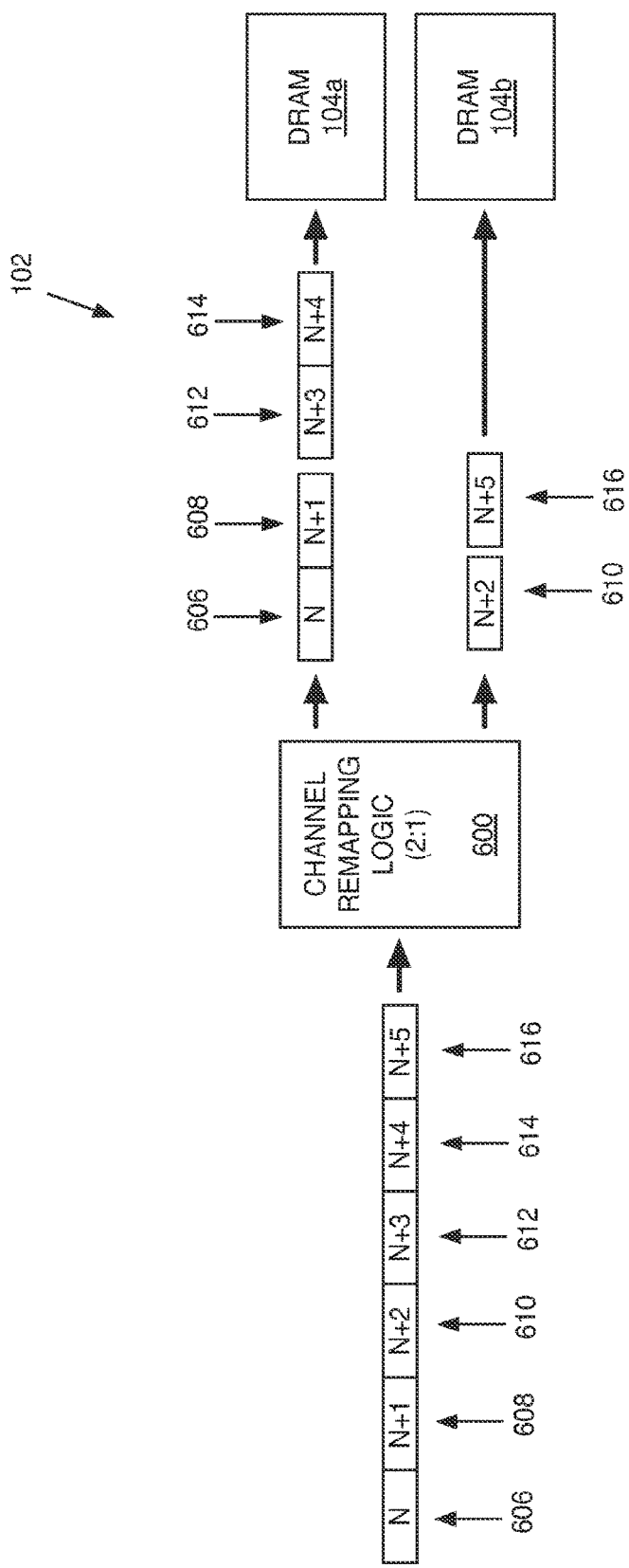
FIG. 6 is a combined flow/block diagram illustrating the general operation, architecture, and functionality of an embodiment of the channel remapping module of FIG. 4

Referring again to the flowchart of FIG. 2, at block 206, the GPU 106 and CPU 108 may access the interleaved memory, in a conventional manner, by sending memory address requests to the memory channel optimization module 102. As illustrated in FIG. 6, traffic may be received by channel remapping logic 600 as an input stream of requests 606, 608, 610, 612, 614, 616, etc. corresponding to address blocks N, N+1, N+2, N+3, N+4, N+5, etc. (FIG. 5). The channel remapping logic 600 is configured to distribute (block 208—FIG. 2) the traffic to the DRAM devices 104a and 104b according to the interleave bandwidth ratio and the appropriate assignment scheme contained in address mapping table 500 (e.g., columns 504, 506, 508, etc.).

Following the above example of a 2:1 interleave bandwidth ratio, the channel remapping logic 600 steers the requests 606, 608, 610, 612, 614, and 616 as illustrated in FIG. 6. Requests 606, 608, 612, and 614 for address blocks N, N+1, N+3, and N+4, respectively, may be steered to DRAM device 104a. Requests 610 and 616 for address blocks N+2, and N+5, respectively, may be steered to DRAM device 104b. In this manner, the incoming traffic from the GPU 106 and the CPU 108 may be optimally matched to the available bandwidth on any of the memory channels 114 for DRAM device 104a and/or the memory channels 118 for DRAM device 104b. This unified mode of operation enables the GPU 106 and the CPU 108 to individually and/or collectively access the combined bandwidth of the dissimilar memory devices rather than being limited to the "localized" high performance operation of the conventional discrete mode of operation.

Figure 7:
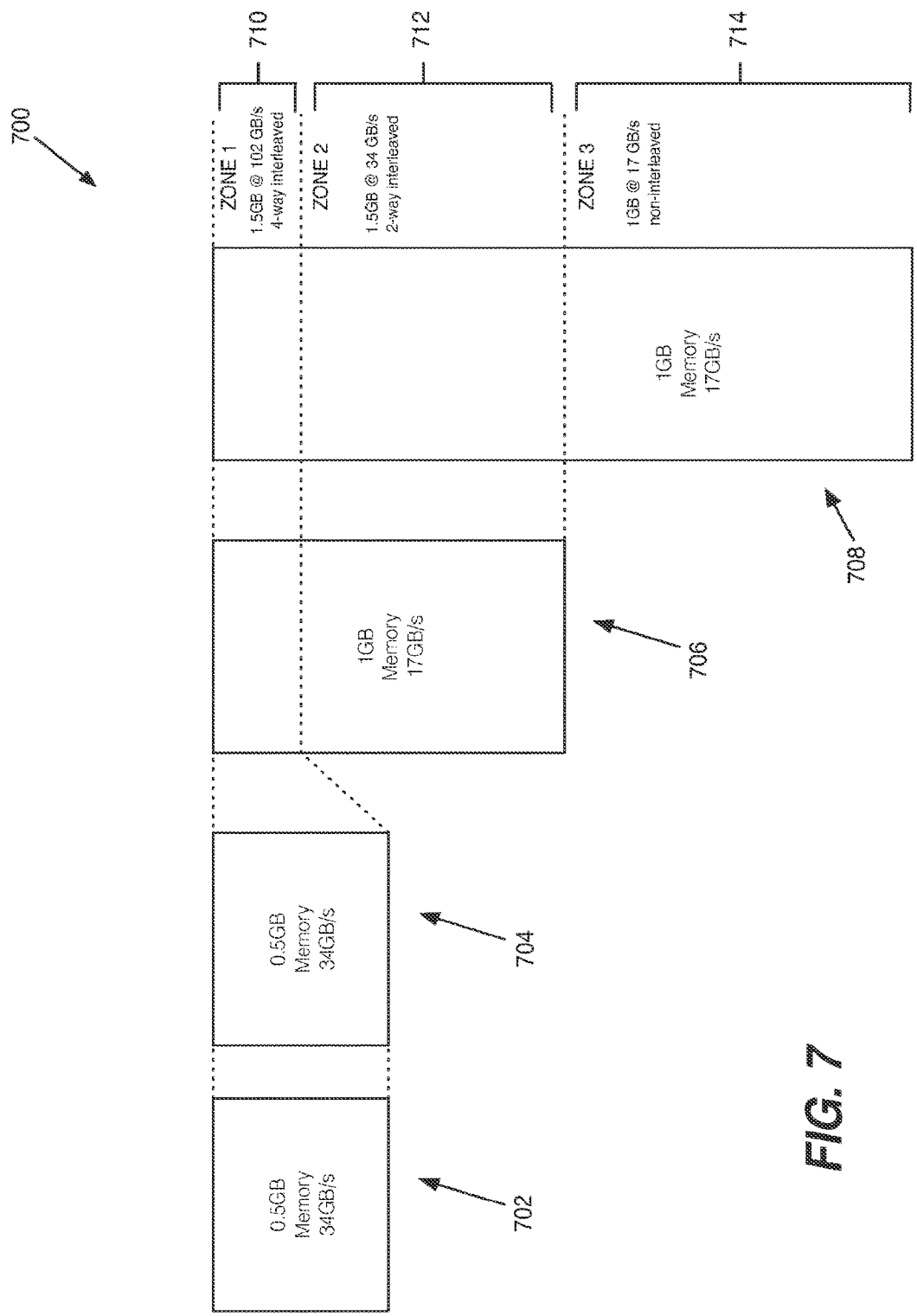
FIG. 7 is a diagram illustrating an embodiment of an interleave method for creating multiple logical zones across dissimilar memory devices.

As mentioned above, the memory channel optimization module 102 may be configured to selectively enable either the unified mode or the discrete mode based on various desirable use scenarios, system settings, etc. Furthermore, it should be appreciated that portions of the dissimilar memory devices may be interleaved rather than interleaving the entire memory devices. FIG. 7 illustrates a multi-layer interleave technique that may be implemented by memory channel optimization module 102 to create multiple "logical" devices or zones. Following the above example using a 2:1 interleave bandwidth ratio, the DRAM device 104*a* may comprise a pair of 0.5 GB memory devices 702 and 704 having a high performance bandwidth of 34 GB/s conventionally optimized for GPU 106. DRAM device 104*b* may comprise a 1 GB memory device 706 and a 2 GB memory device 708 each having a lower bandwidth of 17 GB/s conventionally optimized for CPU 108. The multi-layer interleave technique may create two interleaved zones 710 and 712 and a non-interleaved zone 714. Zone 710 may be 4-way interleaved to provide a combined 1.5 GB at a combined bandwidth of 102 GB/s. Zone 712 may be 2-way interleaved to provide a combined 1.5GB at 34 GB/s/ Zone 714 may be non-interleaved to provide 1 GB at 17 GB/s. The multi-layer interleaving technique combined with the memory management architecture of system 100 may facilitate transitioning between interleaved and non-interleaved portions because the contents of interleaved zones 710 and 712 may be explicitly designated for evictable or migratable data structures and buffers, whereas the contents of non-interleaved zone 714 may be designated for processing, such as, kernel operations and/or other low memory processes.

Figure 8:
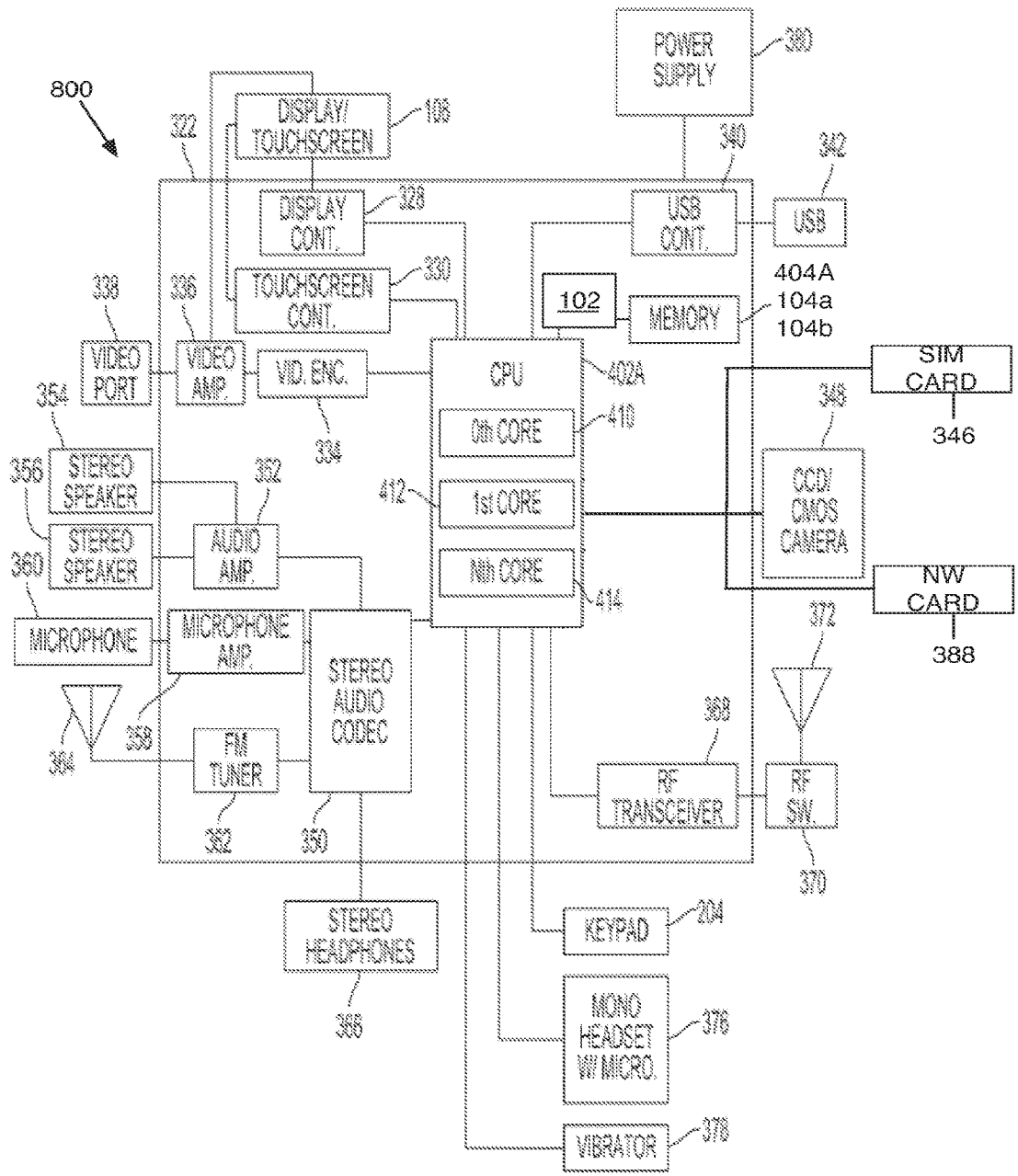
FIG. 8 is a block diagram illustrating an exemplary implementation of the memory channel optimization module in a portable computing device.

As mentioned above, the memory channel optimization module 102 may be incorporated into any desirable computing system. FIG. 8 illustrates the memory channel optimization module 102 incorporated in an exemplary portable computing device (PCD) 800. The memory optimization module 102 may comprise a system-on-a-chip (SoC) or an embedded system that may be separately manufactured and incorporated into designs for the portable computing device 800.

As shown, the PCD 800 includes an on-chip system 322 that includes a multicore CPU 402A. The multicore CPU 402A may include a zeroth core 410, a first core 412, and an Nth core 414. One of the cores may comprise, for example, the GPU 106 with one or more of the others comprising CPU 108. According to alternate exemplary embodiments, the CPU 402 may also comprise those of single core types and not one which has multiple cores, in which case the CPU 108 and the GPU 106 may be dedicated processors, as illustrated in system 100.

A display controller 328 and a touch screen controller 330 may be coupled to the GPU 106. In turn, the touch screen display 108 external to the on-chip system 322 may be coupled to the display controller 328 and the touch screen controller 330.

FIG. 8 further shows that a video encoder 334, e.g., a phase alternating line (PAL) encoder, a sequential color a memoire (SECAM) encoder, or a national television system(s) committee (NTSC) encoder, is coupled to the multicore CPU 402A. Further, a video amplifier 336 is coupled to the video encoder 334 and the touch screen display 108. Also, a video port 338 is coupled to the video amplifier 336. As shown in FIG. 8, a universal serial bus (USB) controller 340 is coupled to the multicore CPU 402A. Also, a USB port 342 is coupled to the USB controller 340. Memory 404A and a subscriber identity module (SIM) card 346 may also be coupled to the multicore CPU 402A. Memory 404A may comprise two or more dissimilar memory devices (e.g., DRAM devices 104*a* and 104*b*), as described above. The memory channel optimization module 102 may be coupled to the CPU 402A (including, for example, a CPU 108 and GPU 106) and the memory 404A may comprise two or more dissimilar memory devices. The memory channel optimization module 102 may be incorporated as a separate system-on-a-chip (SoC) or as a component of SoC 322.

Further, as shown in FIG. 8, a digital camera 348 may be coupled to the multicore CPU 402A. In an exemplary aspect, the digital camera 348 is a charge-coupled device (CCD) camera or a complementary metal-oxide semiconductor (CMOS) camera.

As further illustrated in FIG. 8, a stereo audio coder-decoder (CODEC) 350 may be coupled to the multicore CPU 402A. Moreover, an audio amplifier 352 may coupled to the stereo audio CODEC 350. In an exemplary aspect, a first stereo speaker 354 and a second stereo speaker 356 are coupled to the audio amplifier 352. FIG. 8 shows that a microphone amplifier 358 may be also coupled to the stereo audio CODEC 350. Additionally, a microphone 360 may be coupled to the microphone amplifier 358. In a particular aspect, a frequency modulation (FM) radio tuner 362 may be coupled to the stereo audio CODEC 350. Also, an FM antenna 364 is coupled to the FM radio tuner 362. Further, stereo headphones 366 may be coupled to the stereo audio CODEC 350.

FIG. 8 further illustrates that a radio frequency (RF) transceiver 368 may be coupled to the multicore CPU 402A. An RF switch 370 may be coupled to the RF transceiver 368 and an RF antenna 372. As shown in FIG. 8, a keypad 204 may be coupled to the multicore CPU 402A. Also, a mono headset with a microphone 376 may be coupled to the multicore CPU 402A. Further, a vibrator device 378 may be coupled to the multicore CPU 402A.

FIG. 8 also shows that a power supply 380 may be coupled to the on-chip system 322. In a particular aspect, the power supply 380 is a direct current (DC) power supply that provides power to the various components of the PCD 800 that require power. Further, in a particular aspect, the power supply is a rechargeable DC battery or a DC power supply that is derived from an alternating current (AC) to DC transformer that is connected to an AC power source.

FIG. 8 further indicates that the PCD 800 may also include a network card 388 that may be used to access a data network, e.g., a local area network, a personal area network, or any other network. The network card 388 may be a Bluetooth network card, a WiFi network card, a personal area network (PAN) card, a personal area network ultra-low-power technology (PeANUT) network card, or any other network card well known in the art. Further, the network card 388 may be incorporated into a chip, i.e., the network card 388 may be a full solution in a chip, and may not be a separate network card 388.

As depicted in FIG. 8, the touch screen display 108, the video port 338, the USB port 342, the camera 348, the first stereo speaker 354, the second stereo speaker 356, the microphone 360, the FM antenna 364, the stereo headphones 366, the RF switch 370, the RF antenna 372, the keypad 374, the mono headset 376, the vibrator 378, and the power supply 380 may be external to the on-chip system 322.

FIGS. 9-13 illustrate various alternative embodiments of systems and methods for leveraging aspects of the remapping and interleaving solutions described above in connection with FIGS. 1-8 in a high-level operating system (HLOS) environment. It should be appreciated that the HLOS environment may provide a heterogeneous computing platform or a heterogeneous system architecture (HSA), such as those disclosed in HSA standards published by the HSA Foundation. The current standard, AMD I/O Virtualization Technology (IOMMU) Specification (Publication No. 48882, Revision 2.00, issued Mar. 24, 2011), is hereby incorporated by reference in its entirety.

As known in the art, a system based on a HSA may be configured to provide a unified view of the system memory. HSA permits developers to program at a higher abstraction level by, for example, using mainstream programming languages, abstracting away hardware specifics from the developer, and leaving the hardware-specific coding to be performed by the hardware vendor. However, there is no known solution for efficiently implementing a HSA in a system with dissimilar memory types or devices.

It should be appreciated that the systems and methods described below in connection with FIGS. 9-13 generally provide a unique and desirable solution for supporting a HSA and/or a HLOS in a system comprising dissimilar memory types or devices, such as those described above. The systems and methods described below may provide high performance, lower power, and lower costs by removing the existing need for all memories in the platform to be uniform. Furthermore, hardware developers may have the flexibility to combine, for example, both high and lost cost memory devices and/or types in a computing device which adheres to the HSA standard.

Figure 9:
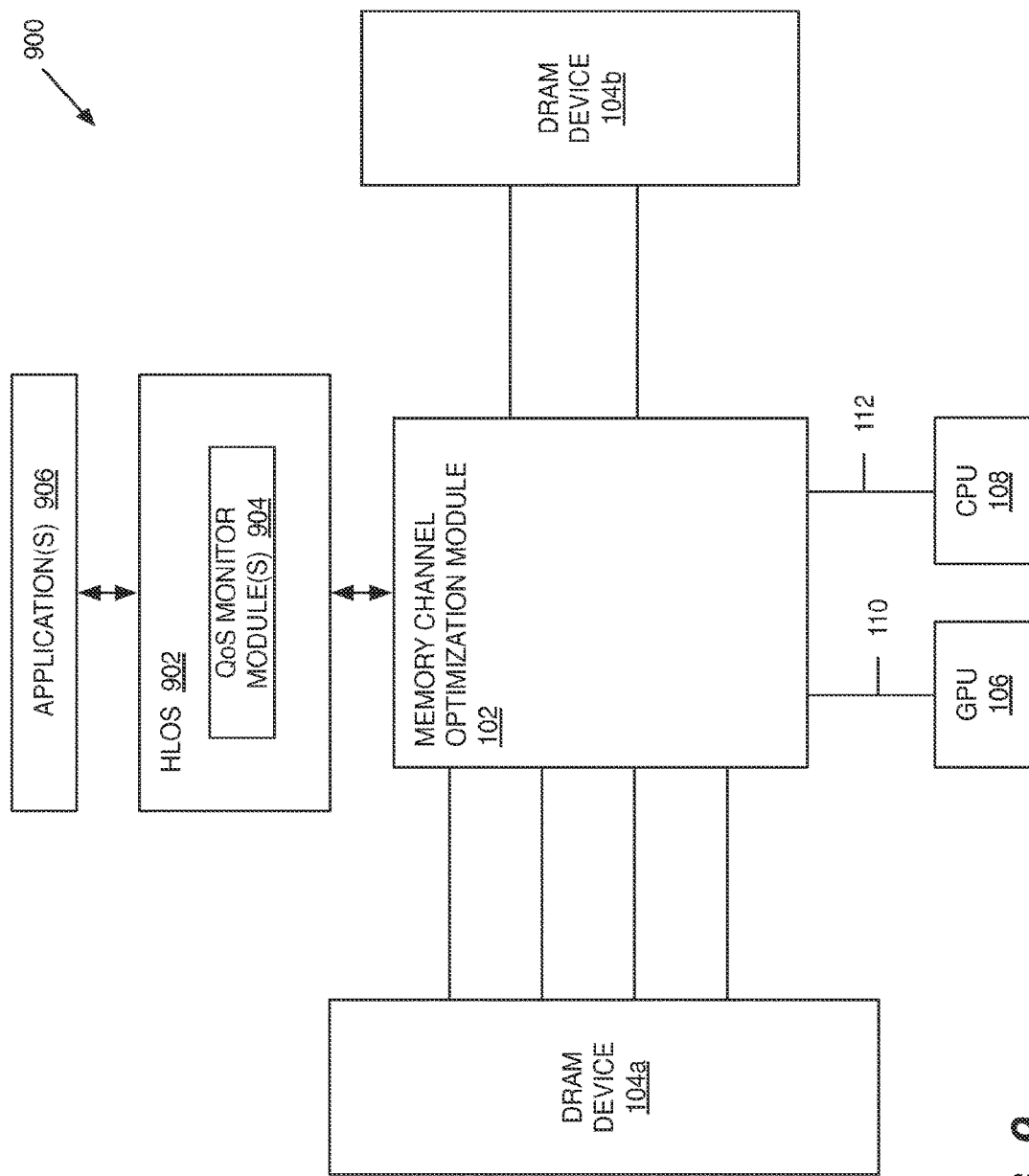
FIG. 9 is a block diagram illustrating another embodiment of a system comprising the memory channel optimization module coupled to high-level operating system (HLOS) for allocating memory to dissimilar memory devices.

FIG. 9 illustrates a system 900 comprising a HLOS 902 in communication with the memory channel optimization module 102 and one or more applications 906 for dynamically allocating memory to dissimilar memory devices. The memory channel optimization module 102 may be generally configured and operate in the manner described above. The memory channel optimization module 102 is electrically connected to two or more dissimilar memory types or devices (e.g., DRAM 104a and 104b) and any number of processing units that may access the dissimilar memory devices. It should be appreciated that the processing units may include dedicated processing units (e.g., a CPU 108 and a GPU 106) or other programmable processors. GPU 106 is coupled to the memory channel optimization module 102 via an electrical connection 110. CPU 108 is coupled to the memory channel optimization module 102 via an electrical connection 112. One or more programmable processors (not shown) may be coupled to the memory channel optimization module 102 via corresponding connections. The dedicated processing units, the programmable processors, and any applications 906 accessing the dissimilar memory devices may be generally referred to as "clients" of the HLOS 902 and/or the memory channel optimization module 102.

The programmable processors may comprise digital signal processor(s) (DSPs) for special-purpose and/or general-purpose applications including, for example, video applications, audio applications, or any other applications 906. As mentioned above, the dedicated processing units, the applications 906, the HLOS 902, and/or the programmable processors may support heterogeneous computing platforms configured to support a heterogeneous system architecture (HSA). It should be appreciated that the HSA creates an improved processor design that exposes to the applications 906 the benefits and capabilities of mainstream programmable computing elements. With HSA, the applications 906 can create data structures in a single unified address space and can initiate work items in parallel on the hardware most appropriate for a given task. Sharing data between computing elements is as simple as sending a pointer. Multiple computing tasks can work on the same coherent memory regions, utilizing barriers and atomic memory operations as needed to maintain data synchronization.

As described above in more detail, the memory channel optimization module 102 further comprises a plurality of hardware connections for coupling to the DRAM 104a and 104b. The hardware connections may vary depending on the type of memory devices. In an embodiment, the dissimilar memory devices comprise a double data rate (DDR) memory device that provide corresponding channels that connect to physical/control connections on the memory channel optimization module 102. It should be appreciated that the number and configuration of the physical/control connections may vary depending on the type of memory device, including the size of the memory addresses (e.g., 32-bit, 64-bit, etc.).

The HLOS 902 comprises quality of service (QoS) monitor module(s) 904. The QoS monitor module(s) 904 provide QoS services to the applications 906 by guaranteeing and/or matching application memory requirements. The QoS services may be based on a programmer-declared QoS provided to the HLOS 902 via, for example, an application programmer interface (API) 1002 associated with the QoS monitor modules 904. In other embodiments, the HLOS 902 may determine an estimated QoS based on monitoring the memory access behavior and/or performance of the applications 906 (e.g., processes, threads, etc.). Further exemplary QoS values may be the memory bandwidth and/or the latency requirements, or other memory performance metric(s), for the data to be allocated on the platform memory such that the application doing the data access is able to satisfy the desired performance and quality.

Figure 10:
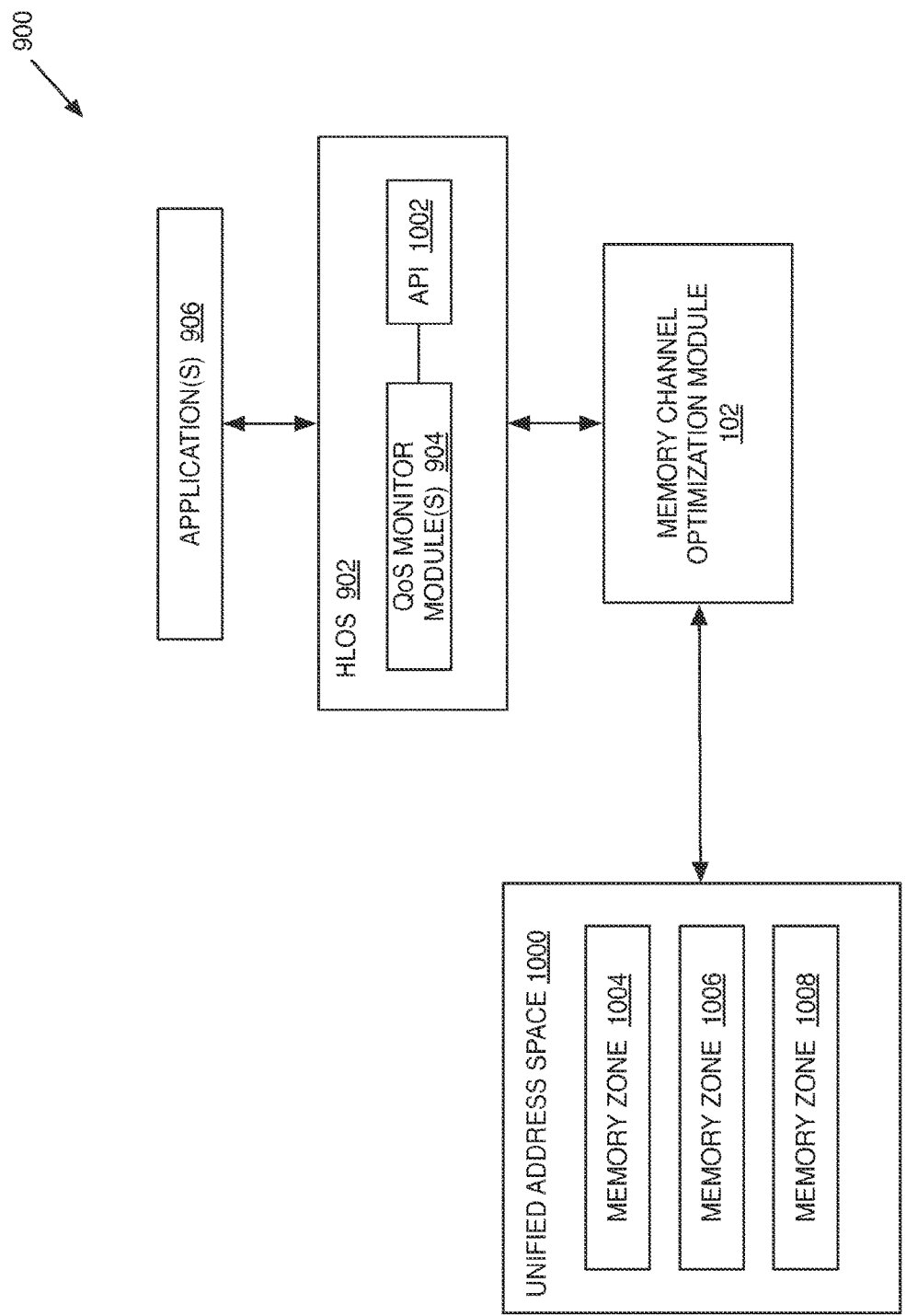
FIG. 10 is block diagram illustrating an embodiment of the architecture and operation of the system of FIG. 9 for allocating memory to zones in a unified memory space via QoS provided by the HLOS.

As illustrated in the embodiment of FIG. 10, the HLOS 902 supports interleaved memory access to the dissimilar memory devices addressed by a unified address space 1000. The unified address space 1000 may comprise one or more logical memory zones (e.g., memory zones 1004, 1006, and 1008). It should be appreciated that the unified address space 1000 and the memory zones 1004, 1006, and 1008 may be configured using the multi-layer interleave technique described above and illustrated in FIG. 7 to create multiple "logical" devices or memory zones. For example, revisiting the above example of FIG. 7, a 2:1 interleave bandwidth ratio may be employed. The DRAM device 104a may comprise a pair of 0.5 GB memory devices 702 and 704 having a high performance bandwidth of 34 GB/s conventionally optimized for GPU 106. DRAM device 104b may comprise a 1 GB memory device 706 and a 2 GB memory device 708 each having a lower bandwidth of 17 GB/s conventionally optimized for CPU 108. The multi-layer interleave technique may create two interleaved zones 710 and 712 and a non-interleaved zone 714. Zone 710 may be 4-way interleaved to provide a combined 1.5 GB at a combined bandwidth of 102 GB/s. Zone 712 may be 2-way interleaved to provide a combined 1.5 GB at 34 GB/s/ Zone 714 may be non-interleaved to provide 1 GB at 17 GB/s. The multi-layer interleaving technique combined with the memory management architecture of system 100 may facilitate transitioning between interleaved and non-interleaved portions because the contents of interleaved zones 710 and 712 may be explicitly designated for evictable or migratable data structures and buffers, whereas the contents of non-interleaved zone 714 may be designated for processing, such as, kernel operations and/or other low memory processes. For purposes of FIG. 10, the memory zones 1004, 1006, and 1008 may correspond to zones 710, 712, and 714 from FIG. 7. Memory zones 1004, 1006, and 1008 may having different density and/or performance levels.

The HLOS 902 integrated with the memory channel optimization module 102 provides an efficient memory allocation scheme. It should be appreciated that the HLOS 902 and/or the memory channel optimization module 102 may allocate memory to different application workloads with varying memory performance requirements through the device. The HLOS 902 is configured to properly manage the allocation/de-allocation of the memory components of varying performance requirement for efficient utilization of the hardware platform.

The QoS monitoring module 904 may allow for dynamically allocated and free virtual memory from one or more of the memory zones 1004, 1006, and 1008. In an embodiment, the QoS monitoring module 904 may assign higher performing zones to tasks/threads associated with applications 906, which may request or otherwise receive higher performance. The QoS monitoring module 904 may assign lower performing zones to tasks/threads that do not request higher performance. Furthermore, the QoS monitoring module 904 may dynamically control memory allocation to fallback from, for example, a first requested zone type to a second or third choice.

The QoS monitoring module 904 may be further configured to audit and migrate or evict processes from higher performing zones based on the credentials of that process and how desirable it may be for that process to exist in that zone. Processes may be audited and migrated or evicted from zones that could be deleted, powered down, etc., thereby offering system power reduction during a sleep mode. The QoS monitoring module 130 may periodically monitor the applications 906 and, based on the monitored performance, evaluate and recommend modifications to the zoning configurations.

The QoS monitoring module 904 may be configured to provide QoS requests or hints when allocating memory for an application code. It should be appreciated that various QoS or related parameters may be monitored by the QoS monitoring module 904 and may indicate, for example, the performance level or the nature of access on the allocated region (e.g., streaming high throughput large contiguous, discrete random access in small chunks, etc.).

The QoS monitoring module 904 may translate the QoS parameter(s) and map them to a particular memory type or memory zone. For instance, random access may use lower memory access latency for efficient implementation of the application code, whereas it may be desirable for streaming high throughput application code to use high memory bandwidth. The QoS parameters may include direct real time values, such as, for example, "memory access latency<x nsec". In the embodiment of FIG. 10 in which the HLOS 902 includes the API 1002, the QoS parameters may be an optional argument to a memory allocation library.

The QoS monitoring module 904 may be configured to augment a memory management module in the kernel to keep track of the dynamic usages of the different types of heterogeneous memory. The augmented memory management module may determine the appropriate allocation of the requested memory to one of the memory zones 1004, 1006, and 1008 based on QoS hints.

It should be appreciated that QoS values need not be used. In the absence of any QoS values, the QoS monitoring module 904 may determine the appropriate memory zones for allocation of application requested memory based on initial runtime performance. The memory zones 1004, 1006, and 1008 may be dynamically shifted from one zone to another if, for example, the runtime performance of the application 906 is impacted based on the current memory zone allocation. In the absence of a QoS parameter, the QoS monitoring module 904 may keep track of the memory access performance of a process and/or thread by tracking if the accesses are relatively large contiguous chunks or randomly accessed. The time gap between each access burst may be used to estimate the QoS parameter.

The QoS monitoring module 904 may be further configured to swap the allocated memory for a particular process or thread to the relevant memory zone that optimally matches the estimated QoS when the particular process/thread is in pending/wait stage. Swapping the allocated memory to a different zone may be avoided during a run state to tradeoff overhead during active execution.

In embodiments implementing an estimated QoS, the QoS monitoring module 904 may be configured to match the current allocated memory zone. The QoS monitoring module 904 may monitor the thread/process for future changes in the memory access behavior. The frequency of monitoring process may be varied as desired. Alternatively, the QoS monitoring module 904 may eliminate further monitoring based on the overall activity on system 900 to reduce the overhead of the monitor process.

It should be appreciated that various hardware structures may be implemented that are configured to extract the memory access behavior/pattern of a process/thread for the purpose of determining the estimated QoS to map the memory allocation to the appropriate memory zone. Furthermore, memory zone allocation can be further granular when different allocations within a particular process/thread could be allocated to different memory zones where the QoS satisfies a broader range. For example, some components may be better suited for high bandwidth streaming data that can survive higher latency by need high throughput compared to, for example, fast random access but low bandwidth memory.

Figure 11:
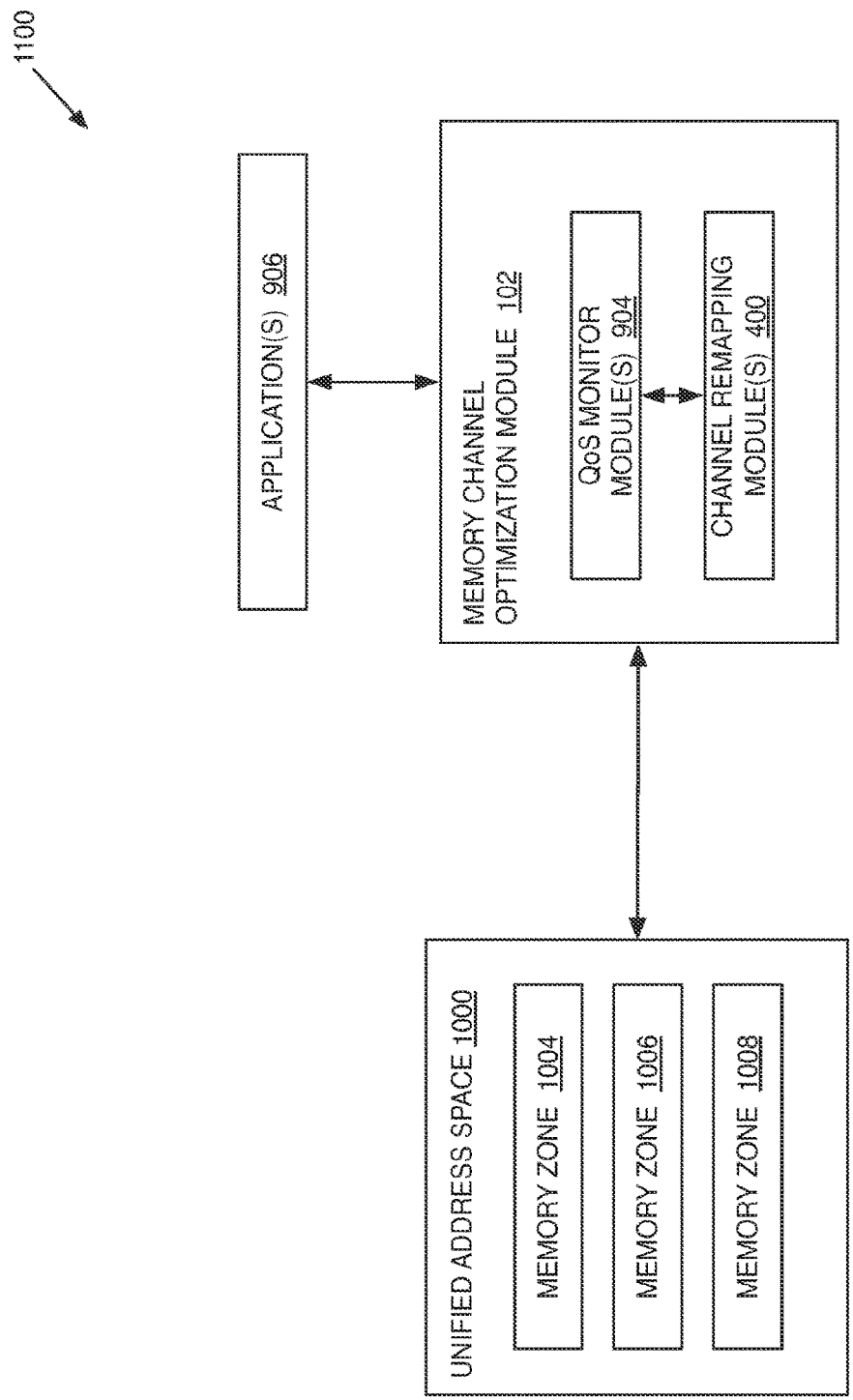
FIG. 11 is a block diagram illustrating another embodiment for allocating memory to zones in a unified memory space via a QoS monitory module integrated with the memory channel optimization module.

FIG. 11 illustrates another embodiment of a system 1100 for integrating one or more of the QoS services described above with the memory channel optimization module 102. This approach may be desirable for accommodating legacy applications 906 that may not be compatible with a QoS solution provided by the HLOS 902. In this embodiment, the memory channel optimization module 102 further comprises the QoS monitoring module(s) 904 that are operatively coupled to the channel remapping module(s) 400 described above.

Figure 12:
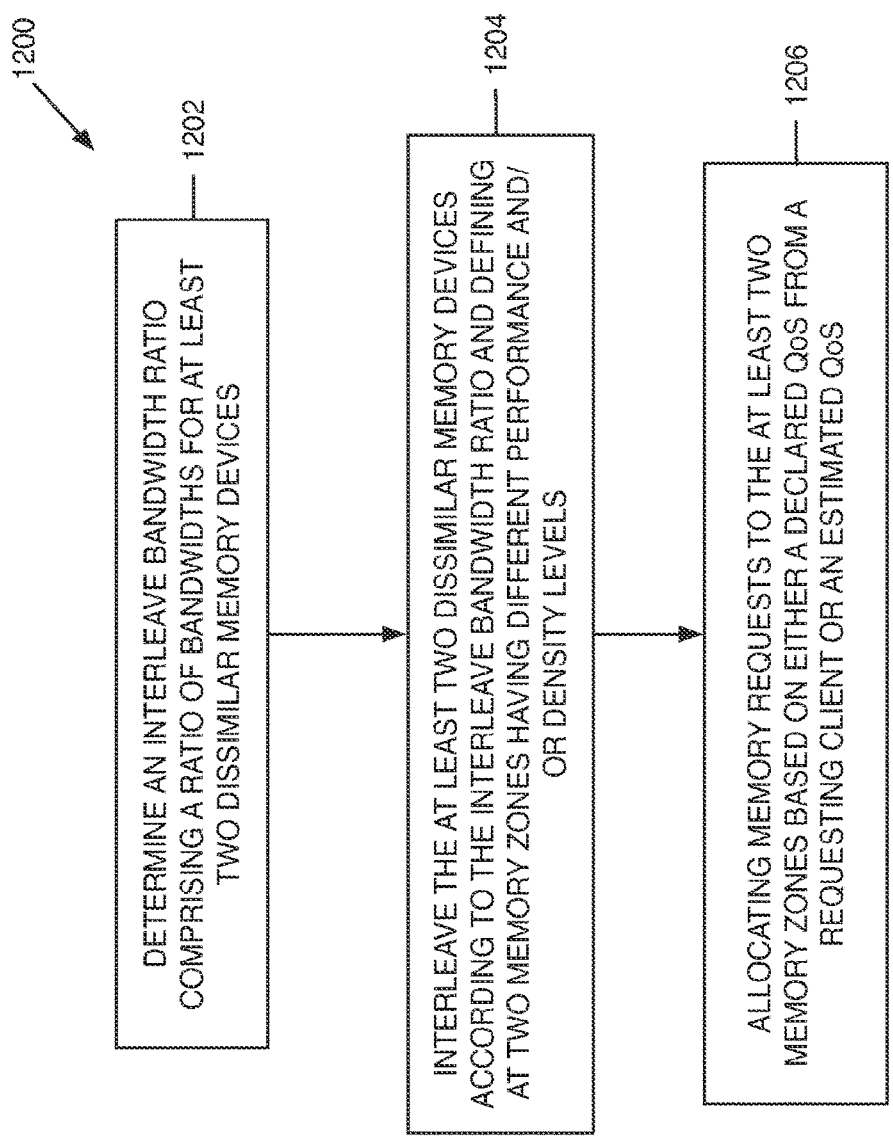
FIG. 12 is a flowchart illustrating an embodiment of a method for dynamically allocating memory to dissimilar memory devices based on a QoS service.

FIG. 12 illustrates a method 1200 for dynamically allocating memory in either the system 900 (FIG. 9) or the system 1100 (FIG. 11) according to the interleaving and remapping approaches described above. At block 1202, an interleave bandwidth ratio is determined. As described above, the interleave bandwidth ratio may comprise a ratio of bandwidths for the two or more dissimilar memory types or devices. At block 1204, the dissimilar memory types or devices are interleaved according to the interleave bandwidth ratio determined at block 1202. Any of the above-described or other interleaving approaches may be implemented to define two or more memory zones (e.g., zone 1004, 1006, and 1008) with each memory zone having a different performance level and/or density level. At block 1206, the HLOS 902 and/or the memory channel optimization module 102 may receive memory address requests from the applications 906 (or other clients). In response, memory is allocated to the appropriate memory zone based on either a declared QoS (e.g., via API 1002) or an estimated QoS.

Figure 13:
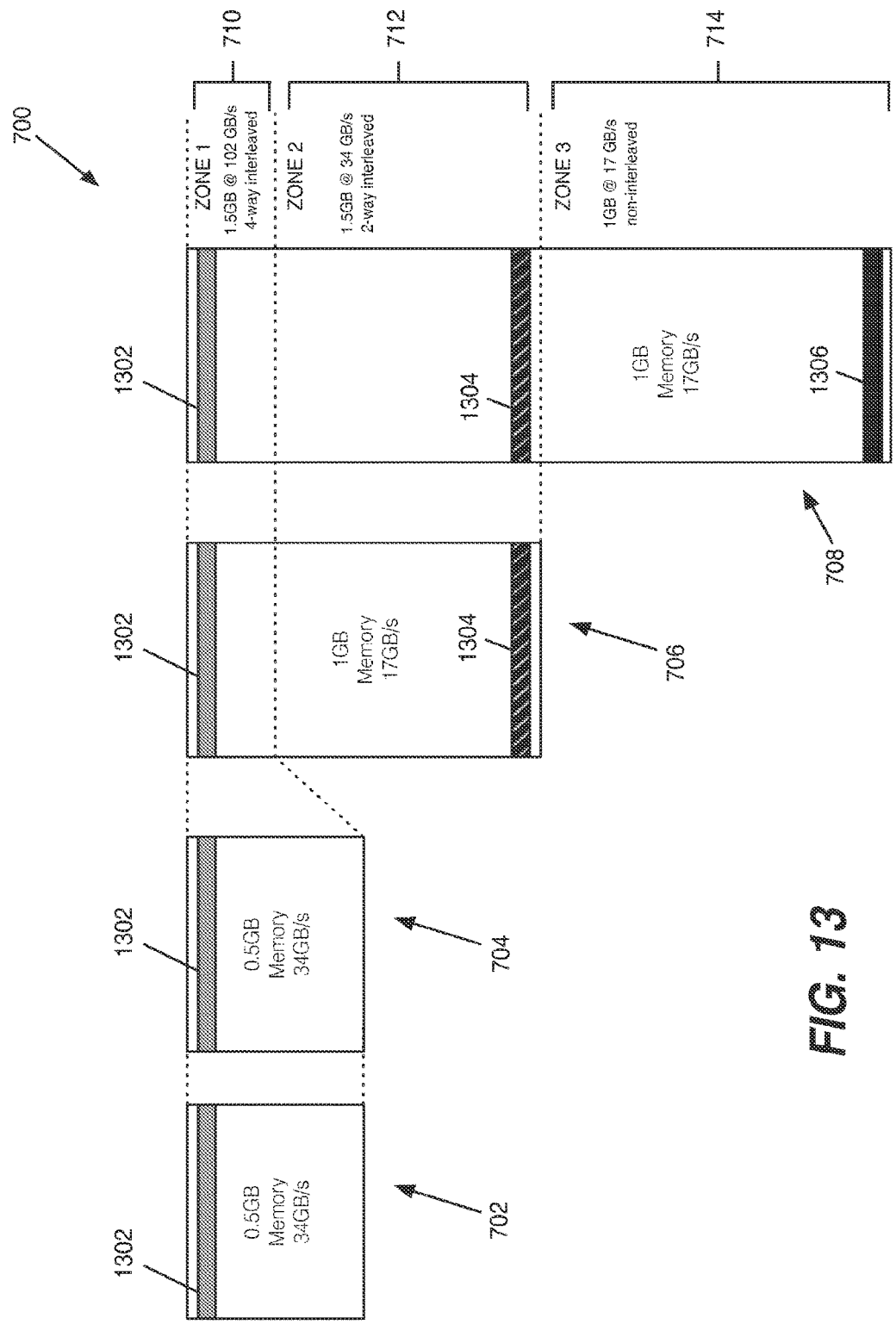
FIG. 13 illustrates the diagram of FIG. 7 for allocating memory to the logical zones via a memory allocation function associated with the HLOS API.

In the embodiment illustrated in FIG. 13, the declared QoS may be implemented using a "malloc" (i.e., memory allocation) function corresponding to the API 1002. Following the above example (FIG. 7) using a 2:1 interleave bandwidth ratio, the DRAM device 104a may comprise a pair of 0.5 GB memory devices 702 and 704 having a high performance bandwidth of 34 GB/s conventionally optimized for GPU 106. DRAM device 104b may comprise a 1 GB memory device 706 and a 2 GB memory device 708 each having a lower bandwidth of 17 GB/s conventionally optimized for CPU 108. The multi-layer interleave technique may create two interleaved zones 710 and 712 and a non-interleaved zone 714. Zone 710 may be 4-way interleaved to provide a combined 1.5 GB at a combined bandwidth of 102 GB/s. Zone 712 may be 2-way interleaved to provide a combined 1.5 GB at 34 GB/s/ Zone 714 may be non-interleaved to provide 1 GB at 17 GB/s. It should be appreciated that the QoS may be applied to all different variants of memory allocation functions, and that "malloc" is used merely as one possible example.

A first malloc function 1302 may be used for declaring a first QoS associated with, for example, the 4-way interleaved memory zone 710. A second malloc function 1304 may be used for declaring a second QoS associated with, for example, the 2-way interleaved zone 712. A third malloc function 1306 may be used for declaring a third QoS associated with, for example, the non-interleaved zone 1306.

It should be appreciated that one or more of the method steps described herein may be stored in the memory as computer program instructions, such as the modules described above. These instructions may be executed by any suitable processor in combination or in concert with the corresponding module to perform the methods described herein.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example.

Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the Figures which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of computer-readable media.

Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A method for allocating memory to dissimilar memory devices of a computing device, the method comprising:
    defining a first memory zone by interleaving a first portion of a first memory device associated with a first processor, the first memory device having a first data bandwidth, and a first portion of a second memory device associated with a second processor, the second memory device having a second data bandwidth different from the first data bandwidth, wherein the first memory device is a different type of device from the second memory device and the first memory zone has a first zone data bandwidth greater than the first or second data bandwidth;
    defining a second memory zone having a second zone data bandwidth different from the first zone data bandwidth, the second memory zone comprising a second portion of at least one of the first and second memory devices; and
    allocating memory address requests between the first and second memory zones based on a quality of service (QoS).

2. The method of claim 1, further comprising determining an interleave bandwidth ratio comprising a ratio of the first data bandwidth of the first memory device and the second data bandwidth of the second memory device.

3. The method of claim 2, wherein interleaving the first portion of the first memory device and the first portion of the second memory device further comprises interleaving the first and second memory devices according to the interleave bandwidth ratio.

4. The method of claim 2, wherein the first memory device comprises a first type of dynamic random access memory (DRAM) and the second memory device comprises a second type of DRAM different than the first type of DRAM.

5. The method of claim 4, wherein one or more of the first type or second type of DRAM comprises a double data rate (DDR) memory.

6. The method of claim 1, wherein the QoS comprises a declared QoS from an application executing on the computing device.

7. The method of claim 1, wherein allocating the memory address requests between the first and second memory zones based on the QoS comprises a high-level operating system (HLOS) receiving the memory address requests.

8. The method of claim 1, wherein the QoS is declared via an application program interface (API) associated with a high-level operating system (HLOS).

9. The method of claim 1, wherein the QoS comprises an estimated QoS based on a current performance of one or more of the memory zones.

10. The method of claim 1, wherein the allocating memory address requests between the first and second memory zones based on the quality of service (QoS) comprises a memory channel optimization module estimating the QoS.

11. A system for allocating memory to dissimilar memory devices of a computing device, the system comprising:
 means for defining a first memory zone by interleaving a first portion of a first memory device associated with a first processor, the first memory device having a first data bandwidth, and a first portion of a second memory device associated with a second processor, the second memory device having a second data bandwidth different from the first data bandwidth, wherein the first memory device is a different type of device from the second memory device and the first memory zone has a first zone data bandwidth greater than the first or second data bandwidth;
 means for defining a second memory zone having a second zone data bandwidth different from the first zone data bandwidth, the second memory zone comprising a second portion of at least one of the first and second memory devices; and
 means for allocating memory address requests between the first and second e memory zones based on a quality of service (QoS), wherein the means for defining the first and second memory zones, and means for allocating memory address requests to the memory zones comprise hardware.

12. The system of claim 11, further comprising means for determining an interleave bandwidth ratio comprising a ratio of the first data bandwidth of the first memory device and the second data bandwidth of the second memory device, wherein the means for determining the interleave bandwidth ratio comprises hardware.

13. The system of claim 12, wherein interleaving the first portion of the first memory device and the first portion of the second memory device further comprises hardware means for interleaving the first and second memory devices according to the interleave bandwidth ratio.

14. The system of claim 12, wherein the first memory device comprises a first type of dynamic random access memory (DRAM) and the second memory device comprises a second type of DRAM different than the first type of DRAM.

15. The system of claim 14, wherein one or more of the first type or second type of DRAM comprises a double data rate (DDR) memory.

16. The system of claim 11, wherein the QoS comprises one of a declared QoS from an application or an estimated QoS.

17. The system of claim 11, wherein the means for allocating comprises one of a high-level operating system (HLOS) and memory channel optimization module.

18. The system of claim 11, wherein the QoS is declared via an application program interface (API) associated with a high-level operating system (HLOS).

19. The system of claim 11, wherein the QoS comprises an estimated QoS based on a current performance of one or more of the memory zones.

20. The system of claim 11, wherein the means for allocating memory address requests between the first and second memory zones based on the quality of service (QoS) comprises a memory channel optimization module estimating the QoS.

21. A memory system for managing memory devices in a computer device, the memory system comprising:
 a first memory device associated with a first processor, the first memory device having a first data bandwidth;
 a second memory device associated with a second processor, the second memory device having a second data bandwidth different from the first data bandwidth, wherein the second memory device is a different type of device from the first memory device;
 a memory channel optimization module in communication with the first and second memory devices and operable to:
  define a first memory zone by interleaving a first portion of the first memory device and a first portion of the second memory device, the first memory zone having a first zone data bandwidth greater than the first or second data bandwidth, and
  define a second memory zone comprising a second portion of at least one of the first and second memory devices, the second memory zone having a second zone data bandwidth different from the first zone data bandwidth; and
 a high-level operating system (HLOS) in communication with the memory channel optimization module for allocating memory address requests from one or more applications executing on the computer device to the first and second memory zones based on a quality of service (QoS).

22. The memory system of claim 21, wherein the memory channel optimization module is operable in a discrete mode of operation to only allocate memory address requests to a non-interleaved portion of the first of second memory devices.

23. The memory system of claim 21, wherein the memory channel optimization module determines an interleave bandwidth ratio comprising a ratio of the first data bandwidth of the first memory device and the second data bandwidth of the second memory device.

24. The memory system of claim 23, wherein the memory channel optimization module interleaves the first portion of the first memory device and the first portion of the second memory device according to the interleave bandwidth ratio.

25. The memory system of claim 21, wherein the first memory device comprises a first type of double data rate (DDR) memory and the second memory device comprises a second type of DDR memory different than the first type of DDR.

26. The memory system of claim 21, wherein the HLOS receives the QoS via an associated application program interface (API).

27. The memory system of claim 21, wherein the memory channel optimization module is further operable to estimate the QoS based on a current performance level for one or more of the memory zones.

28. The memory system of claim 21, wherein the QoS comprises one of a declared QoS from an application or an estimated QoS.

29. The system of claim 21, wherein the QoS is declared via an application program interface (API) associated with the high-level operating system (HLOS).

30. The system of claim 21, wherein the QoS comprises an estimated QoS based on a current performance of one or more of the memory zones.

31. A computer program product comprising a non-transitory computer usable medium having a computer readable program code embodied therein, the computer readable program code adapted to be executed to implement a method for dynamically allocating memory to dissimilar memory devices of a computing device, the method comprising:
 defining a first memory zone by interleaving a first portion of a first memory device associated with a first processor, the first memory device having a first data bandwidth, and a first portion of a second memory device associated with a second processor, the second memory device having a second data bandwidth different from the first data bandwidth, wherein the first memory device is a different type of device from the second memory device and the first memory zone has a first zone data bandwidth greater than the first or second data bandwidth;
 defining a second memory zone having a second zone data bandwidth different from the first zone data bandwidth, the second memory zone comprising a second portion of at least one of the first and second memory devices; and
 allocating memory address requests between the first and second memory zones based on a quality of service (QoS).

32. The computer program product of claim 31, wherein the method further comprises determining an interleave bandwidth ratio comprising a ratio of the first data bandwidth of the first memory device and the second data bandwidth of the second memory device.

33. The computer program product of claim 32, wherein the method further comprises interleaving the first portion of the first memory device and the first portion of the second memory device according to the interleave bandwidth ratio.

34. The computer program product of claim 31, wherein the first memory device comprises a first type of dynamic random access memory (DRAM) and the second memory device comprises a second type of DRAM different than the first type of DRAM.

35. The computer program product of claim 34, wherein one or more of the first type or second type of DRAM comprises a double data rate (DDR) memory.

36. The computer program product of claim 31, wherein the QoS comprises a declared QoS from an application.

37. The computer program product of claim 31, allocating the memory address requests between the first and second memory zones based on the declared QoS comprises a high-level operating system (HLOS) receiving the memory address requests.

38. The computer program product of claim 31, wherein the QoS is declared via an application program interface (API) associated with a high-level operating system (HLOS).

39. The computer program product of claim 31, wherein the QoS comprises an estimated QoS based on a current performance of one or more of the memory zones.

40. The computer program product of claim 31, wherein the allocating memory address requests between the first and second memory zones based on the quality of service (QoS) comprises a memory channel optimization module estimating the QoS.

* * * * *